(12) United States Patent
Opris

(10) Patent No.: US 7,375,665 B1
(45) Date of Patent: May 20, 2008

(54) IMAGE PROCESSING METHOD AND ANALOG FRONT END CIRCUIT

(76) Inventor: Ion E. Opris, 2198 Lark Hills Ct., San Jose, CA (US) 95138

( * ) Notice: Subject to any disclaimer, the term of this patent is extended or adjusted under 35 U.S.C. 154(b) by 0 days.

(21) Appl. No.: 11/511,566

(22) Filed: Aug. 28, 2006

Related U.S. Application Data

(63) Continuation of application No. 10/437,832, filed on May 13, 2003, now Pat. No. 7,098,832.

(51) Int. Cl.
*H03M 1/00* (2006.01)
(52) U.S. Cl. .................................. 341/139; 348/229.1
(58) Field of Classification Search ................ 341/139, 341/155, 143, 156; 348/229.1
See application file for complete search history.

(56) References Cited

U.S. PATENT DOCUMENTS

| | | | |
|---|---|---|---|
| 6,441,851 B1 * | 8/2002 | Yonemoto | 348/294 |
| 6,670,901 B2 * | 12/2003 | Brueske et al. | 341/139 |
| 7,042,383 B2 * | 5/2006 | Mishra et al. | 341/156 |
| 7,081,921 B2 * | 7/2006 | Nitta et al. | 348/229.1 |

* cited by examiner

*Primary Examiner*—Rexford Barnie
*Assistant Examiner*—Joseph Lauture

(57) ABSTRACT

An image processing system includes a charge-coupled device sensor having a wide input dynamic range, and an analog front end circuit coupled to the charge-coupled device sensor. The front end circuit includes an analog-to-digital converter module to receive an input analog signal from the charge-coupled device sensor, the analog-to-digital converter module having a signal to noise ratio corresponding to a predetermined number of bits and a higher resolution than the predetermined number of bits. The front end circuit further includes a digital multiplier module coupled to the analog-to-digital converter module, the analog-to-digital converter module and the digital multiplier module to adjust a full scale input range at the analog-to-digital converter module over the wide range without loss in analog-to-digital conversion resolution.

4 Claims, 6 Drawing Sheets

IMAGE PROCESSING METHOD AND ANALOG FRONT END CIRCUIT

CROSS-REFERENCE TO RELATED APPLICATION

This patent application is a continuation of U.S. patent application Ser. No. 10/437,832, filed on May 13, 2003 now U.S. Pat. No. 7,098,832, and entitled "IMAGE PROCESSING METHOD AND ANALOG FRONT END CIRCUIT," which is incorporated by reference herein in its entirety.

FIELD OF THE INVENTION

The present invention relates generally to electronic circuits and, more particularly, to an image processing method and analog front end circuit.

BACKGROUND OF THE INVENTION

High-end consumer and professional applications in a wide range of digital image acquisition systems, such as, for example, digital video camcorders, digital still cameras, personal computer video teleconferencing, digital copiers, and infrared image digitizers, require ever better image quality. Several attempts have been made to process signals received from certain sensor devices in such image systems and to provide high resolution output signals.

FIG. 1 is a block diagram illustrating an exemplary digital image acquisition system 100. The system 100 includes an image processing analog front end circuit 110 coupled to a Charge-Coupled Device (CCD) sensor 105, and further coupled to a digital image processing module 120, which includes a digital image processing unit 122, a compression and formatting unit 124, and a media interface 126.

FIG. 2 is a schematic diagram of a prior art image processing analog front end circuit 110 within the digital image acquisition system 100. As illustrated in FIG. 2, the circuit 110 includes an amplifier module 210, such as, for example a Programmable Gain Amplifier (PGA), coupled to an Analog-to-Digital Converter (ADC) module 220.

The PGA 210 is implemented with gain stages to receive an input analog signal 205 from the CCD sensor 105 and to amplify the analog signal 205 to the full scale range of the ADC module 220 in order to obtain an amplified analog signal 215. The ADC module 220 performs analog to digital conversion of the amplified analog signal 215. The ADC module 220 converts the amplified analog signal 215 into a digital output signal 225 through quantization and encoding operations. The ADC module 220 subdivides the range of the amplified analog signal 215 into a finite number of intervals, for example $2^n-1$ intervals, where "n" represents the number of bits available for a corresponding binary word of each interval, such as, for example, a value between 10 bits and 14 bits. Next, a binary word is assigned to each interval, i.e. to each range of signals, the binary word representing the digital representation of any signal that falls within that interval.

Because an entire interval of the input range is represented by a single digital value, some errors are necessarily present in the conversion operation and are called quantization errors. If a quantization error is different for different independent colors, this quantization error translates into image artifacts, such as, for example, color noise.

FIG. 3 is a diagram illustrating quantization values for separate independent colors. As shown in FIG. 3, considering the analog to digital output granularity as a function of the light intensity, different quantization errors on each independent color, for example the red and blue colors shown, create significant artifacts in the processed image.

In order to avoid such image artifacts, the PGA 210 is used before the ADC module 220 to equalize the relative amplitudes of the input signal for the different colors. This operation is sometimes called white balancing. The white balancing is performed in the digital image processing unit 120 of the image acquisition system 100, but partial color equalization is necessary to be done in the analog domain, prior to the ADC module 220, in order to avoid the image artifacts.

However, the addition of the PGA 210 to the analog front end circuit 110 takes a large portion of the total power dissipation and adds extra thermal noise to the signal path.

Thus, what is needed is an image processing method and analog front end circuit that will increase the resolution of the output signal without a corresponding increase in the power dissipation and noise within the circuit.

SUMMARY OF THE INVENTION

An image processing method and analog front end circuit are described. The circuit includes an analog-to-digital converter module to receive an input analog signal from a charge-coupled device sensor having a wide input dynamic range, the analog-to-digital converter module having a signal to noise ratio corresponding to a predetermined number of bits and a higher resolution than the predetermined number of bits. The circuit further includes a digital multiplier module coupled to the analog-to-digital converter module, the analog-to-digital converter module and the digital multiplier module to adjust a full scale input range at the analog-to-digital converter module over the wide range without loss in analog-to-digital conversion resolution.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

According to embodiments described herein, an image processing method and analog front end circuit are described. The circuit includes an analog-to-digital converter module to receive an input analog signal from a charge-coupled device sensor having a wide input dynamic range, and to convert the input signal into a digital signal, the analog-to-digital converter module having a signal to noise ratio corresponding to a predetermined number of bits and a resolution higher than the predetermined number of bits. The circuit further includes a digital multiplier module coupled to the analog-to-digital converter module to receive and amplify the digital signal, the analog-to-digital converter module and the digital multiplier module to adjust a full scale input range without loss in analog-to-digital conversion resolution.

In the following detailed description of embodiments of the invention, reference is made to the accompanying drawings in which like references indicate similar elements, and in which are shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

Figure 1:
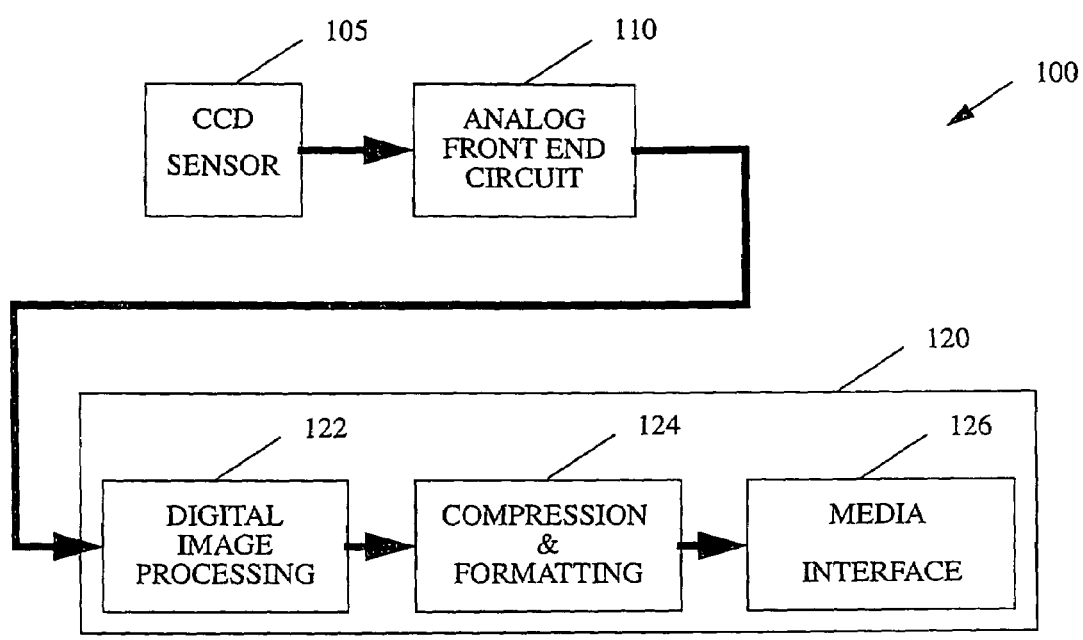
FIG. 1 is a block diagram illustrating an exemplary digital image acquisition system.
Figure 2:
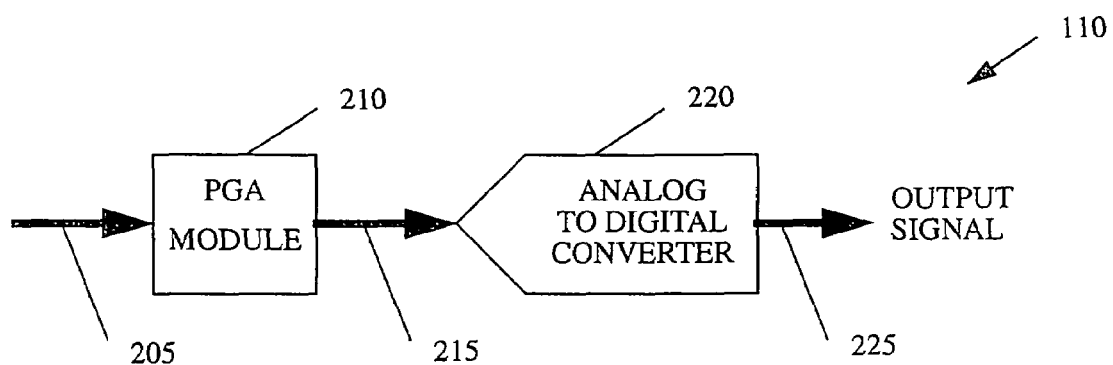
FIG. 2 is a schematic diagram of a prior art image processing analog front end circuit within the digital image acquisition system.
Figure 3:
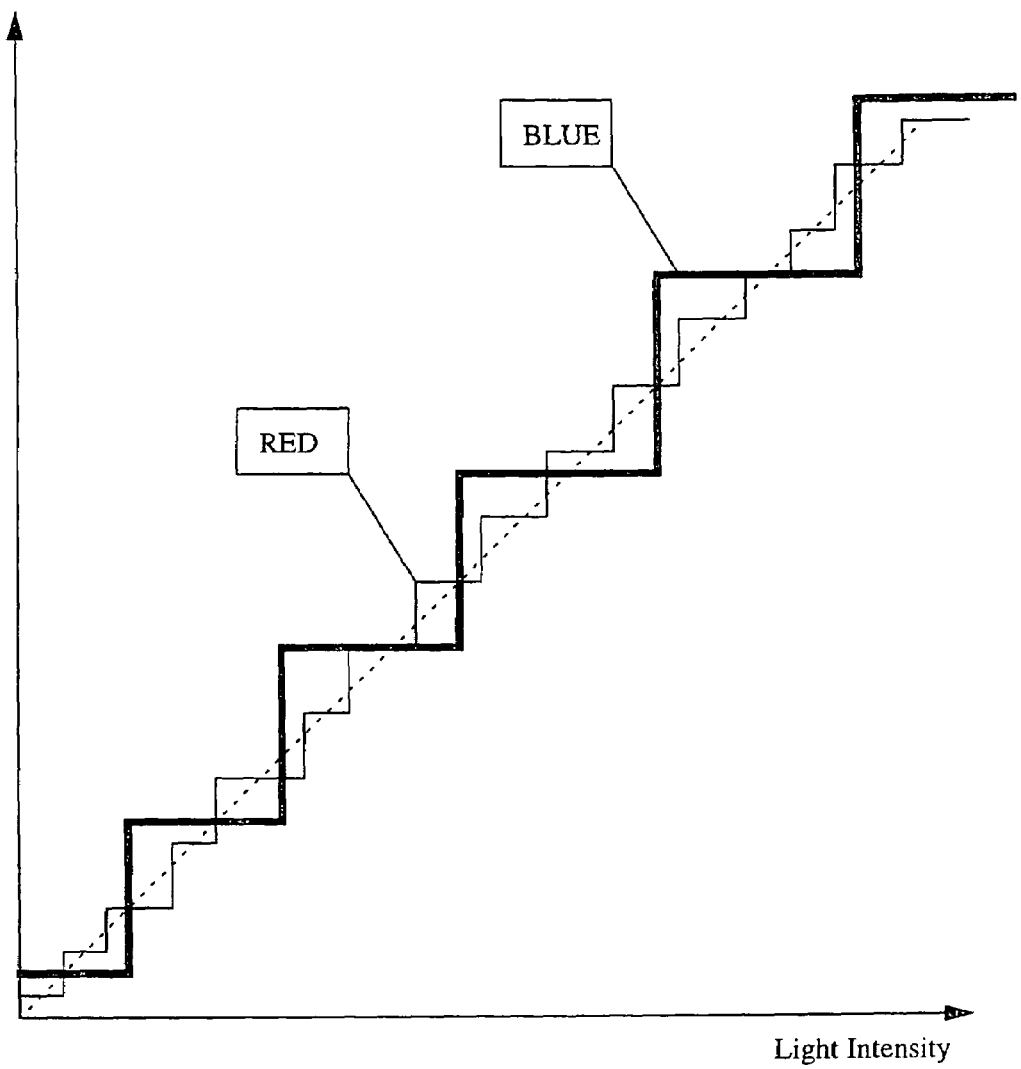
FIG. 3 is a diagram illustrating quantization values for separate independent colors.
Figure 4:
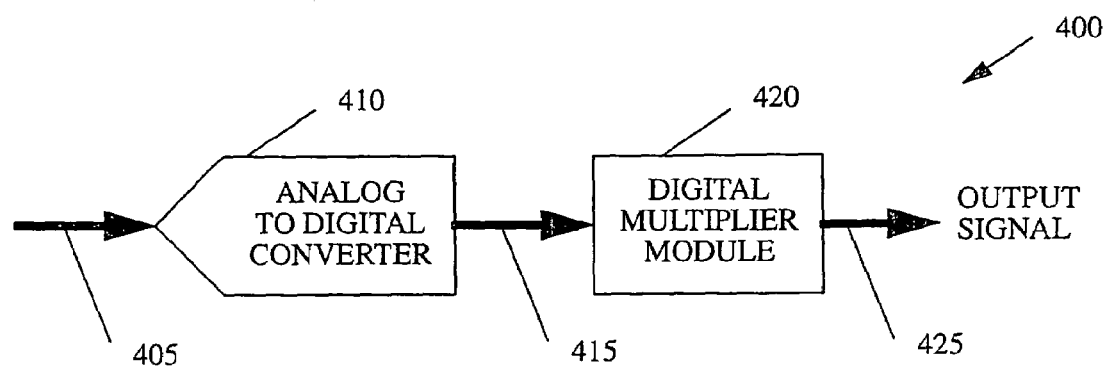
FIG. 4 is a schematic diagram of an image processing analog front end circuit, according to one embodiment of the present invention.

FIG. 4 is a schematic diagram of an image processing analog front end circuit 400, according to one embodiment of the present invention. As illustrated in FIG. 4, in one embodiment, an Analog-to-Digital Converter (ADC) module 410 is coupled to a digital multiplier module 420. An input of the ADC module 410 is coupled to a data acquisition module (not shown), such as the charge-coupled device (CCD) sensor 105 shown in FIG. 1, and an output of the ADC module 410 is coupled to an input of the digital multiplier module 420.

The ADC module 410 is a module capable to perform the operations described herein, such as, for example, an A/D pipeline converter module. The ADC module 410 receives an analog signal 405 from the CCD sensor 105, for example, and converts the analog signal 405 to digital form through quantization and encoding operations to obtain a digital signal 415.

In one embodiment, the ADC module 410 subdivides the range of the analog signal 405 into a finite number of intervals. The ADC module 410 has a signal to noise ratio corresponding to a predetermined number of bits "n" and a resolution higher than the predetermined number of bits "n" and corresponding to an increased "m" number of bits available for each binary word of an associated interval, where m=n+a, with "a" an additional number of bits provided to create smaller intervals and, therefore, increase the accuracy of the digital representation of the analog signal 405. In one embodiment, for "n" in a range of 10 to 14 bits, "a" is in a range of 4 to 6 additional bits, and "m" is in the range of 14 to 20 bits. Alternatively, other ranges for the bit values of m, n, and a may be selected to accomplish a similar result.

In A/D pipeline converters, for example, the power dissipation is mainly determined by the input referred noise and it has a very weak dependence on the actual resolution, since, in order to increase the resolution, additional stages may be added to the end of the pipeline without a significant power dissipation impact.

As a result, in the circuit 400 illustrated in FIG. 4, the resolution of the ADC module 410 is increased without a significant power increase. Since the digital multiplier module 420 consumes less power than PGAs and does not introduce additional random noise, the circuit 400 accomplishes a reduction in power dissipation while the noise remains substantially similar or may be improved.

In one embodiment, the digital multiplier module 420 is a programmable hardware and/or software module capable to perform the operations described herein. The multiplier module 420 receives and multiplies the digital signal 415 and outputs an amplified digital output signal 425.

Figure 5:
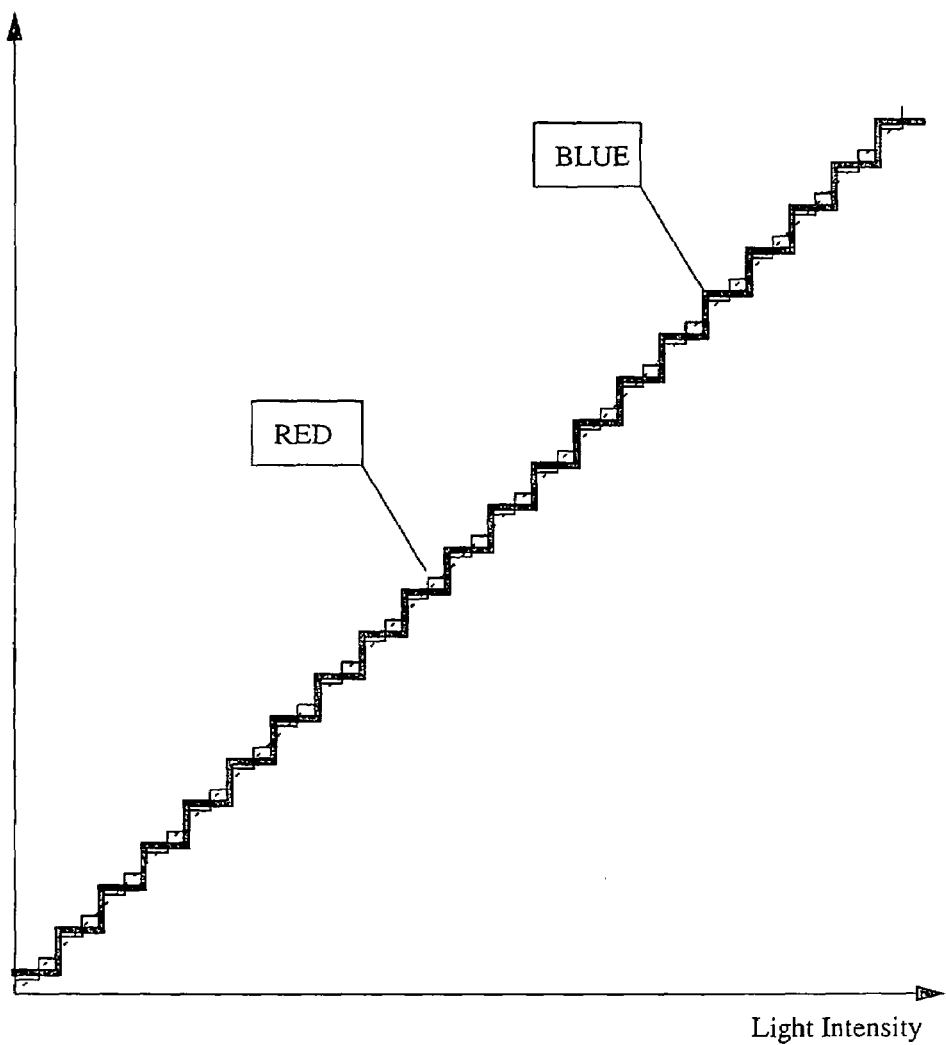
FIG. 5 is a diagram illustrating one embodiment of quantization values for independent colors in the image processing front end circuit of the present invention.

FIG. 5 is a diagram illustrating one embodiment of quantization values for independent colors in the image processing front end circuit of the present invention. As illustrated in FIG. 5, due to the increased resolution of the digital output signal 425, the quantization noise on different independent colors, such as, for example, the red and blue colors, is reduced, the intervals become smaller, and the function becomes more linear.

Figure 6:
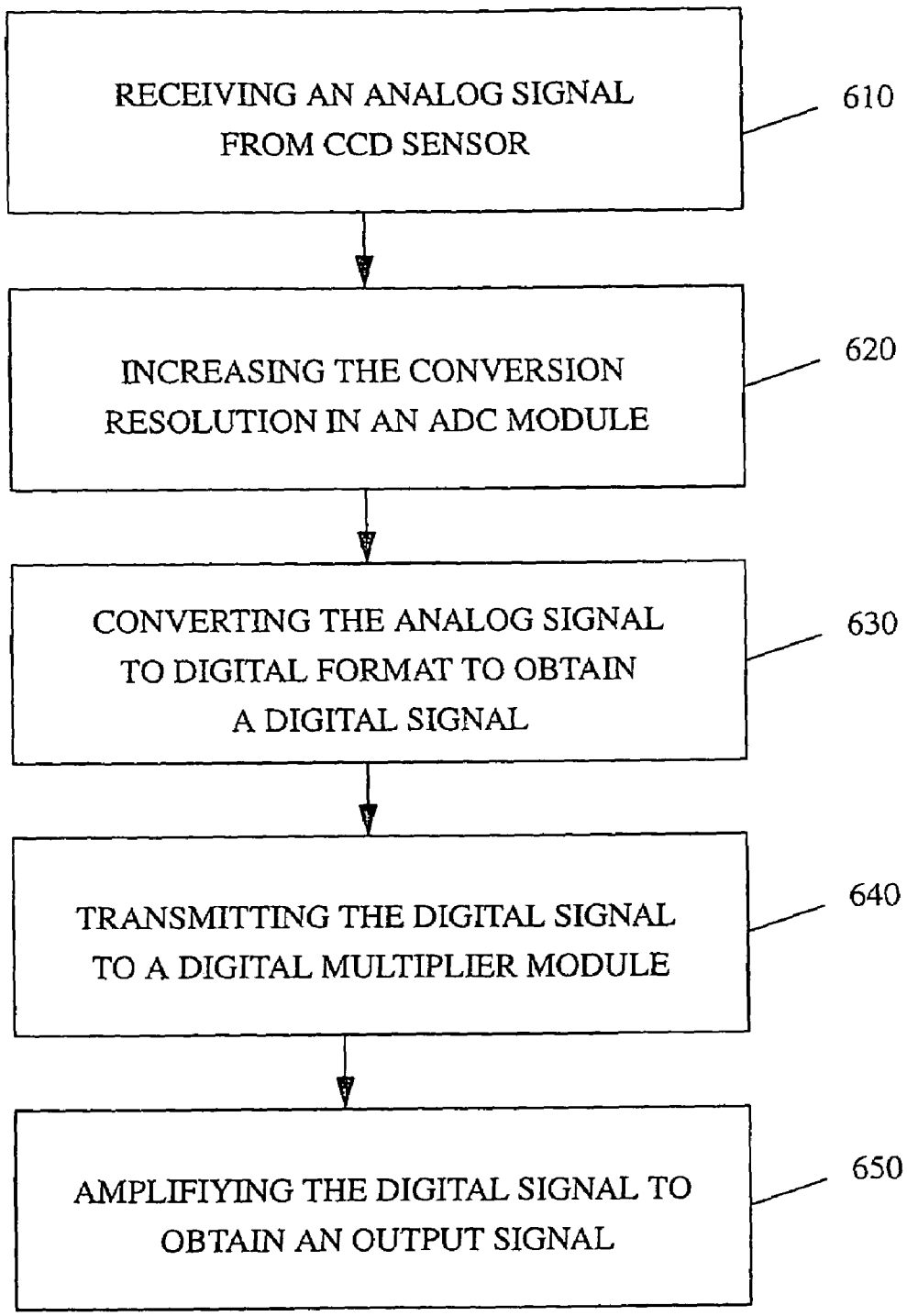
FIG. 6 is a flow diagram of an image processing method, according to one embodiment of the present invention.

FIG. 6 is a flow diagram of an image processing method, according to one embodiment of the present invention. As illustrated in FIG. 6, at processing block 610, an analog signal 405 is received from a CCD sensor 105. At processing block 620, the conversion resolution in an analog-to-digital converter module 410 is increased by increasing the number of bits available for conversion operations. At processing block 630, the analog signal 405 is converted to digital form in the ADC module 410 to obtain a digital signal 415. At processing block 640, the digital signal 415 is transmitted to a digital multiplier module 420. Finally, at processing block 650, the digital signal 415 is amplified with the digital multiplier module 420 to obtain an amplified digital output signal 425.

It is to be understood that embodiments of the present invention may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above. Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit comprising:
an analog-to-digital converter module to receive an input analog signal from a charge-coupled device sensor having a wide input dynamic range, and to convert said input analog signal into a digital signal, said analog-to-digital converter module having a signal to noise ratio corresponding to a predetermined number of bits and a resolution of a number of bits higher than said predetermined number of bits corresponding to said signal to noise ratio, such that by applying a digital gain, no resolution is lost beyond said predetermined number of bits corresponding to said signal to noise ratio; and
a digital multiplier module coupled to said analog-to-digital converter module to receive and amplify said digital signal.

2. The circuit according to claim 1, wherein said analog-to-digital converter module and said digital multiplier module adjust a full scale input range at said analog-to-digital converter module over said wide range without loss in analog-to-digital conversion resolution.

3. A system comprising:
a charge-coupled device sensor having a wide input dynamic range; and
a front end circuit coupled to said charge-coupled device sensor, said front end circuit further comprising
an analog-to-digital converter module to receive an input analog signal from said charge-coupled device sensor, and to convert said input analog signal into a digital signal, said analog-to-digital converter module having a signal to noise ratio corresponding to a predetermined number of bits and a resolution of a number of bits higher than said predetermined number of bits corresponding to said signal to noise ratio, such that by applying a digital gain, no resolution is lost beyond said predetermined number of bits corresponding to said signal to noise ratio; and
a digital multiplier module coupled to said analog-to-digital converter module to receive and amplify said digital signal.

4. The system of claim 3, wherein said analog-to-digital converter module and said digital multiplier module adjust a full scale input range at said analog-to-digital converter module over said wide range without loss in analog-to-digital conversion resolution.

* * * * *